(12) United States Patent
Yoshii et al.

(10) Patent No.: US 12,140,648 B2
(45) Date of Patent: Nov. 12, 2024

(54) MAGNETIC FIELD MEASUREMENT APPARATUS AND MAGNETIC FIELD MEASUREMENT METHOD

(71) Applicants: SUMIDA CORPORATION, Tokyo (JP); Kyoto University, Kyoto (JP)

(72) Inventors: Yoshiharu Yoshii, Natori (JP); Tsutomu Otsuka, Natori (JP); Masateru Hashimoto, Natori (JP); Norikazu Mizuochi, Kyoto (JP); Kan Hayashi, Kyoto (JP); Yuki Takemura, Kyoto (JP)

(73) Assignee: Kyocera Document Solutions, Inc. (JP)

( * ) Notice: Subject to any disclaimer, the term of this patent is extended or adjusted under 35 U.S.C. 154(b) by 17 days.

(21) Appl. No.: 17/922,473

(22) PCT Filed: Apr. 15, 2021

(86) PCT No.: PCT/JP2021/015543
§ 371 (c)(1),
(2) Date: Oct. 31, 2022

(87) PCT Pub. No.: WO2021/229993
PCT Pub. Date: Nov. 18, 2021

(65) Prior Publication Data
US 2023/0184853 A1 Jun. 15, 2023

(30) Foreign Application Priority Data

May 12, 2020 (JP) .................. 2020-083739

(51) Int. Cl.
*G01V 3/00* (2006.01)
*G01R 33/24* (2006.01)

(52) U.S. Cl.
CPC ................... *G01R 33/24* (2013.01)

(58) Field of Classification Search
CPC ............ G01R 33/3415; G01R 33/543; G01R 33/5659; G01R 33/36; A61B 5/055
USPC ........................................ 324/301
See application file for complete search history.

(56) References Cited

FOREIGN PATENT DOCUMENTS

| CN | 108333207 A | * | 7/2018 | ............ G01N 24/10 |
| JP | 2012-110489 | | 6/2012 | |
| JP | 2016023965 A | * | 2/2016 | |

* cited by examiner

*Primary Examiner* — Walter L Lindsay, Jr.
*Assistant Examiner* — Frederick Wenderoth

(57) ABSTRACT

A magnetic resonance member 1 includes a diamond crystal including plural diamond nitrogen vacancy center, and a high-frequency magnetic field generator 2 applies magnetic field of microwave to the magnetic resonance member 1. The aforementioned plural diamond nitrogen vacancy centers include diamond nitrogen vacancy centers arranged in directions of predetermined plural axes among four axes that indicates four connection directions of carbon atoms in the diamond crystal; and the aforementioned magnetic resonance member 1 is arranged in a direction that provides a substantially largest sensitivity of the measurement target magnetic field in the diamond nitrogen vacancy centers arranged in the predetermined plural axes.

8 Claims, 6 Drawing Sheets

MAGNETIC FIELD MEASUREMENT APPARATUS AND MAGNETIC FIELD MEASUREMENT METHOD

TECHNICAL FIELD

The present invention relates to a magnetic field measurement apparatus and a magnetic field measurement method.

BACKGROUND ART

A magnetic measurement apparatus performs magnetic measurement with ODMR (Optically Detected Magnetic Resonance) that uses electron spin resonance (See Patent Literature #1, for example).

In ODMR, a magnetic resonance member that has sublevels and optical transition levels is irradiated with a high-frequency magnetic field (microwave) and light for excitation between the sublevels and the optical transition levels, and thereby a population change or the like due to magnetic resonance between the sublevels is detected as an optical signal with high sensitivity. In general, after an electron in a ground state is excited with green light, the electron emits red light when returning to the ground state. For example, after an electron is irradiated with a high-frequency magnetic field of about 2.87 GHz in a nitrogen and a lattice defect in a diamond structure (NV Center: Nitrogen Vacancy Center) and thereby the electron is initialized on the basis of photoexcitation, the electron moves from the lowest level (spin magnetic quantum number ms=0) among three sublevels of the ground state to an energy level (ms=+1 or −1) higher than the lowest level among the three sublevels. When the electron in such state is irradiated with green light, an emitting light intensity is decreased because of no radiation transition to the lowest level (ms=0) of the three sublevels of the ground level; and therefore, by detecting this light, it can be determined whether magnetic resonance occurs due to the high-frequency magnetic field. As mentioned, ODMR uses an optically detected magnetic resonance member such as a diamond including an NV Center.

A measurement method of a DC (Direct Current) magnetic field using an NV Center is performed in accordance with Ramsey Pulse Sequence. In Ramsey Pulse Sequence, (a) an NV Center is irradiated with excitation light, (b) a first pi/2 pulse of a microwave is applied to the NV Center, (c) a second pi/2 pulse of a microwave is applied to the NV Center with a predetermined time interval tt from the first pi/2 pulse, (d) the NV Center is irradiated with measurement light, and an emitted light intensity of the NV Center is measured, and (e) a magnetic flux density is estimated on the basis of the measured intensity.

Further, a measurement method of an AC (Alternating Current) magnetic field using an NV Center is performed in accordance with Spin Echo Pulse Sequence. In Spin Echo Pulse Sequence, (a) an NV Center is irradiated with excitation light, (b) a first pi/2 pulse of a microwave is applied to the NV Center at 0-degree phase of a measurement target magnetic field, (c) a pi pulse of a microwave is applied to the NV Center at 180-degree phase of the measurement target magnetic field, (d) a second pi/2 pulse of a microwave is applied to the NV Center at 360-degree phase of the measurement target magnetic field, (e) the NV Center is irradiated with measurement light, and an emitted light intensity of the NV Center is measured, and (f) a magnetic flux density is estimated on the basis of the measured intensity of the light.

CITATION LIST

Patent literature

PATENT LITERATURE #1: Japan Patent Application Publication No. 2012-110489.

SUMMARY OF INVENTION

Technical Problem

A diamond nitrogen vacancy center (NV Center) has a sensitivity to a magnetic field component in parallel with an arrangement orientation of the nitrogen and the vacancy (hereinafter also called as N-V orientation), and therefore, a measurement target magnetic field Bt may not be detected with a favorable sensitivity dependently on a difference between a direction of the measurement target magnetic field Bt and the N-V orientation.

The present invention has been conceived in view of the aforementioned problem, and it is an object of the present invention to obtain a magnetic field measurement apparatus and a magnetic field measurement method that detect a measurement target magnetic field Bt with a favorable sensitivity.

Solution to Problem

A magnetic field measurement apparatus according to the present invention includes a magnetic resonance member that includes a diamond crystal including plural diamond nitrogen vacancy center; a high-frequency magnetic field generator that applies a magnetic field as a microwave to the magnetic resonance member; a high frequency power supply that causes the high-frequency magnetic field generator to conduct a current for the microwave; a detecting device that detects a physical phenomenon corresponding to a measurement target magnetic field in the magnetic resonance member; a measurement control unit that controls the high frequency power supply and determines a detection value detected by the detecting device; and a calculation unit that calculates the measurement target magnetic field on the basis of the detection value. Further, the plural diamond nitrogen vacancy centers include diamond nitrogen vacancy centers arranged in directions of predetermined plural axes among four axes that indicates four connection directions of carbon atoms in the diamond crystal; and the magnetic resonance member is arranged in a direction that provides a substantially largest sensitivity of the measurement target magnetic field in the diamond nitrogen vacancy centers arranged in the predetermined plural axes.

A magnetic field measurement method according to the present invention includes the steps of: applying magnetic field of microwave to a magnetic resonance member that includes a diamond crystal including plural diamond nitrogen vacancy center; detecting a physical phenomenon corresponding to a measurement target magnetic field in the magnetic resonance member and determining a detection value of the physical phenomenon; and calculating the measurement target magnetic field on the basis of the detection value.

Further, the plural diamond nitrogen vacancy centers include diamond nitrogen vacancy centers arranged in directions of predetermined plural axes among four axes that indicates four connection directions of carbon atoms in the diamond crystal; and the magnetic resonance member is arranged in a direction that provides a substantially largest sensitivity of the measurement target magnetic field in the diamond nitrogen vacancy centers arranged in the predetermined plural axes.

Advantageous Effect of Invention

By means of the present invention, obtained are a magnetic field measurement apparatus and a magnetic field measurement method that detect a measurement target magnetic field Bt with a favorable sensitivity.

DESCRIPTION OF EMBODIMENTS

Hereinafter, embodiments according to aspects of the present invention will be explained with reference to a drawing.

Embodiment 1

Figure 1:
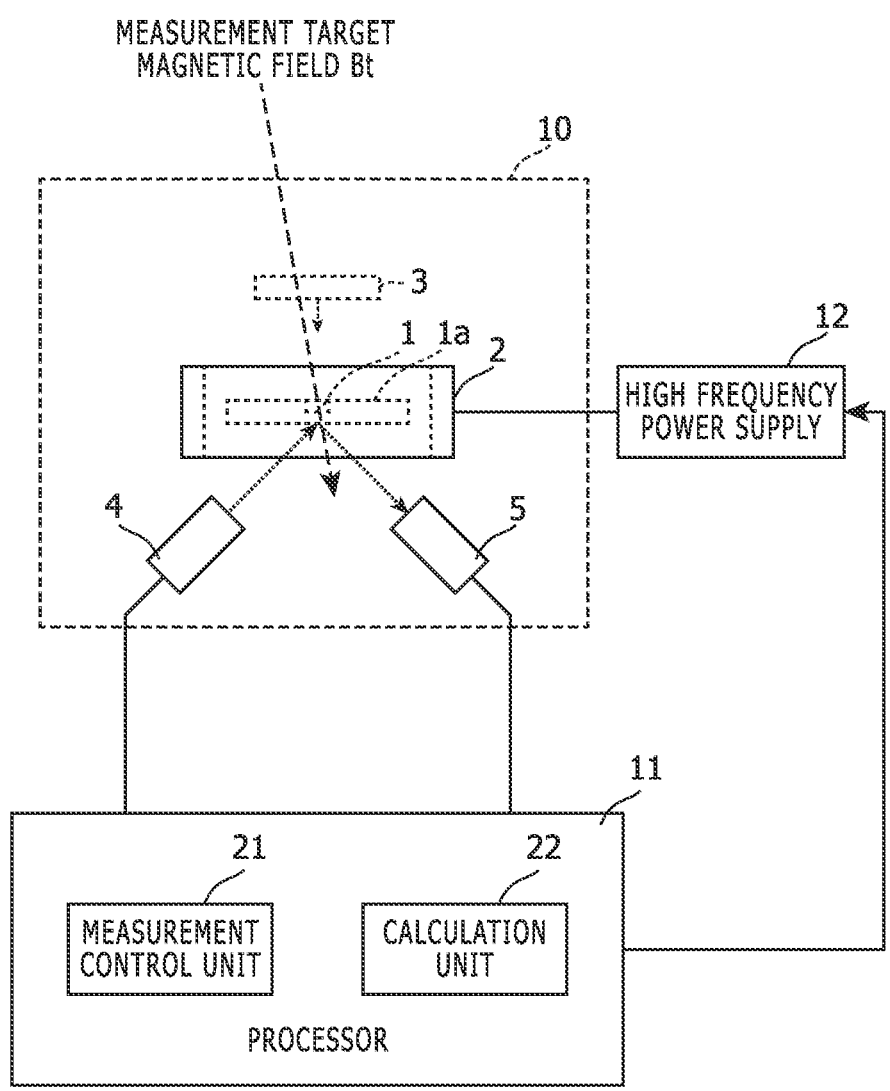
FIG. 1 shows a diagram that indicates a configuration of a magnetic field measurement apparatus according to an embodiment of the present invention.

FIG. 1 shows a diagram that indicates a configuration of a magnetic field measurement apparatus according to an embodiment of the present invention. The magnetic field measurement apparatus shown in FIG. 1 includes a magnetic sensor unit 10, a processor 11, and a high frequency power supply 12.

The magnetic sensor unit 10 detects a measurement target magnetic field (e.g. an intensity of it or the like) at a predetermined position (e.g. on or over a surface of a test target object). The measurement target magnetic field may be a DC magnetic field, an AC magnetic field of a single frequency, or an AC magnetic field that includes plural frequency components and has a predetermined period.

In this embodiment, the magnetic sensor unit 10 includes a magnetic resonance member 1, a high-frequency magnetic field generator 2. Further, if required, the magnetic sensor unit 10 includes a static magnetic field generating unit 3.

The magnetic resonance member 1 includes a diamond crystal including plural diamond nitrogen vacancy centers (NV Centers). The magnetic resonance member 1 is an "ensemble" magnetic resonance member, and in this embodiment, used as an optically detected magnetic resonance member. Here, the magnetic resonance member 1 is a plate member of a diamond crystal, and is fixed to a supporting member 1a.

The high-frequency magnetic field generator 2 applies a microwave mentioned below to the magnetic resonance member 1. The high frequency power supply 12 generates a current for the microwave, and causes the high-frequency magnetic field generator 2 to conduct the current. For example, the high-frequency magnetic field generator 2 is a coil, an LC resonance device, a sort of a slit antenna or a rod antenna, or a combination of such devices.

The static magnetic field generating unit 3 applies a static magnetic field (DC magnetic field) that causes Zeeman splitting of the energy level of the NV Centers in the magnetic resonance member 1. A permanent magnet, a coil (i.e. electromagnet) or the like is used as the static magnetic field generating unit 3. If a coil is used as the static magnetic field generating unit 3, a DC power supply is installed and electrically connected to this coil, and supplies DC current and thereby the static magnetic field is generated. In the NV Center, the ground level is a triplet level of ms=0, +1, −1, and levels of ms=+1 and ms=−1 are Zeeman-splitting by the aforementioned static magnetic field. The NV Center in the magnetic resonance member 1 has a Zeeman-splittable energy level and can take plural orientations (i.e. the aforementioned N-V orientations) of which energy level shift amounts due to Zeeman splitting are different from each other.

Further, in this embodiment, the magnetic sensor unit 10 includes the irradiating device 4 and the light receiving device 5 as a detecting device that detects physical phenomenon (here, fluorescence) corresponding to the measurement target magnetic field using the magnetic resonance member 1. The irradiating device 4 irradiates the magnetic resonance member 1 as an optically detected magnetic resonance member with light (excitation light of a predetermined wavelength and measurement light of a predetermined wavelength). The light receiving device 5 detects fluorescence emitted from the magnetic resonance member 1 when the magnetic resonance member 1 is irradiated with the measurement light. It should be noted that here the physical phenomenon is optically detected, but may be change of an electric characteristic (resistance value change of the magnetic resonance member 1 or the like) and may be electrically detected.

Figure 2:
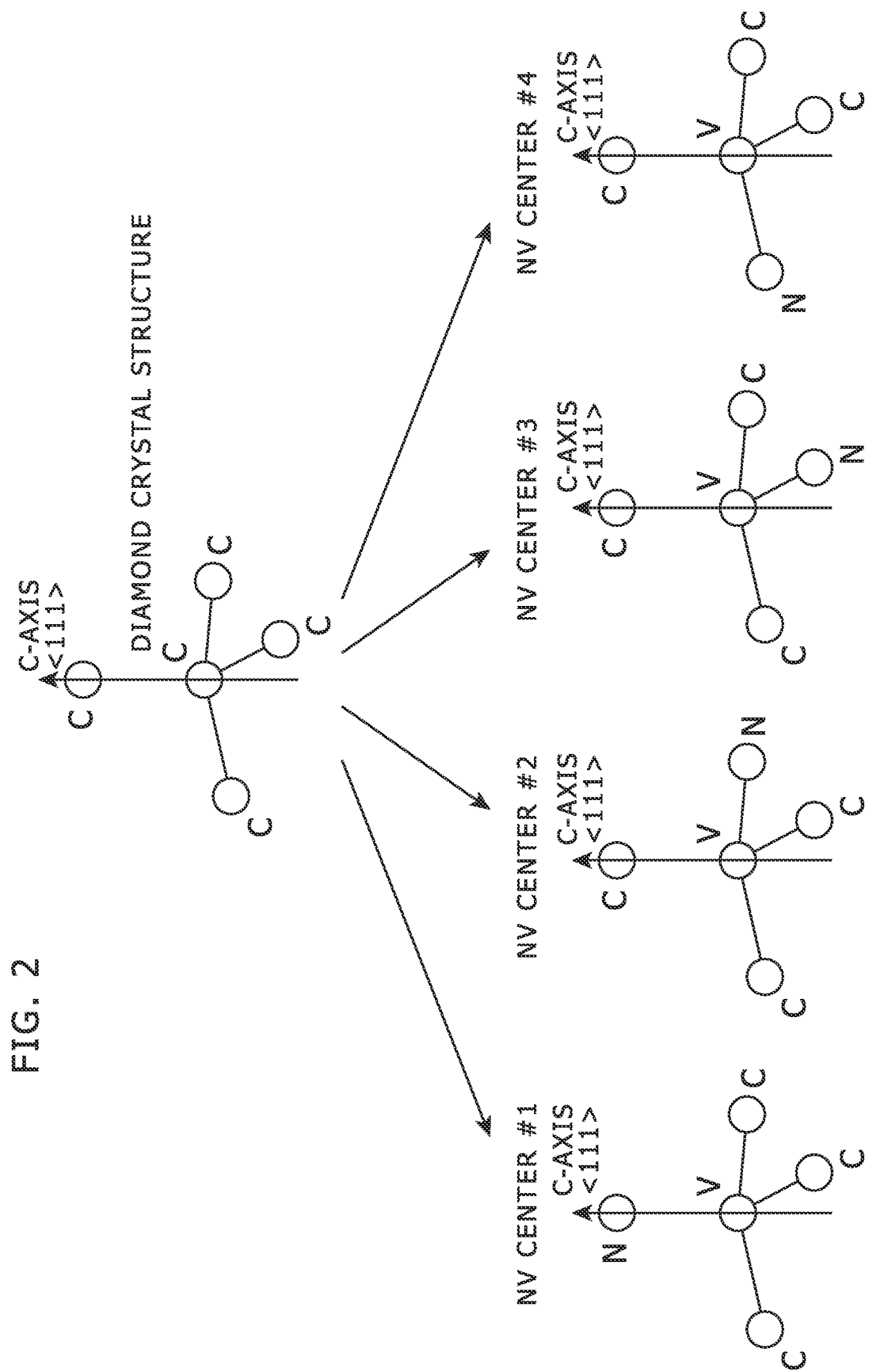
FIG. 2 shows a diagram that explains plural orientations of an NV Center in a magnetic resonance member 1 shown in FIG. 1.

FIG. 2 shows a diagram that explains plural orientations of an NV Center in a magnetic resonance member 1 shown in FIG. 1. As shown in FIG. 2, in a diamond crystal, an NV Center is formed by a vacancy (hole) (V) and a nitrogen (N) as an impurity. A nitrogen (N) takes one of four positions adjacent to a defect (vacancy, V) in a diamond crystal.

The magnetic resonance member 1 includes NV Centers of plural (two, three or four) N-V orientations among the four N-V orientations; each NV Center has one of the four N-V orientations on the basis of a positional relationship between a nitrogen and a vacancy in a diamond crystal lattice, and reacts to the measurement target magnetic field Bt with a strength corresponding to an angle between an N-V orientation and the measurement target magnetic field Bt because an NV Center has a sensitivity to a component of the measurement target magnetic field Bt in parallel with the N-V orientation.

As mentioned, the plural NV Centers include diamond nitrogen vacancy centers arranged in directions of predetermined plural axes (hereinafter, called as target axes) among four axes that indicates four connection directions of carbon atoms in the diamond crystal. Further, the magnetic resonance member 1 is arranged in a direction that provides a substantially largest sensitivity of the measurement target magnetic field in the diamond nitrogen vacancy centers arranged in the predetermined plural target axes.

Figure 3:
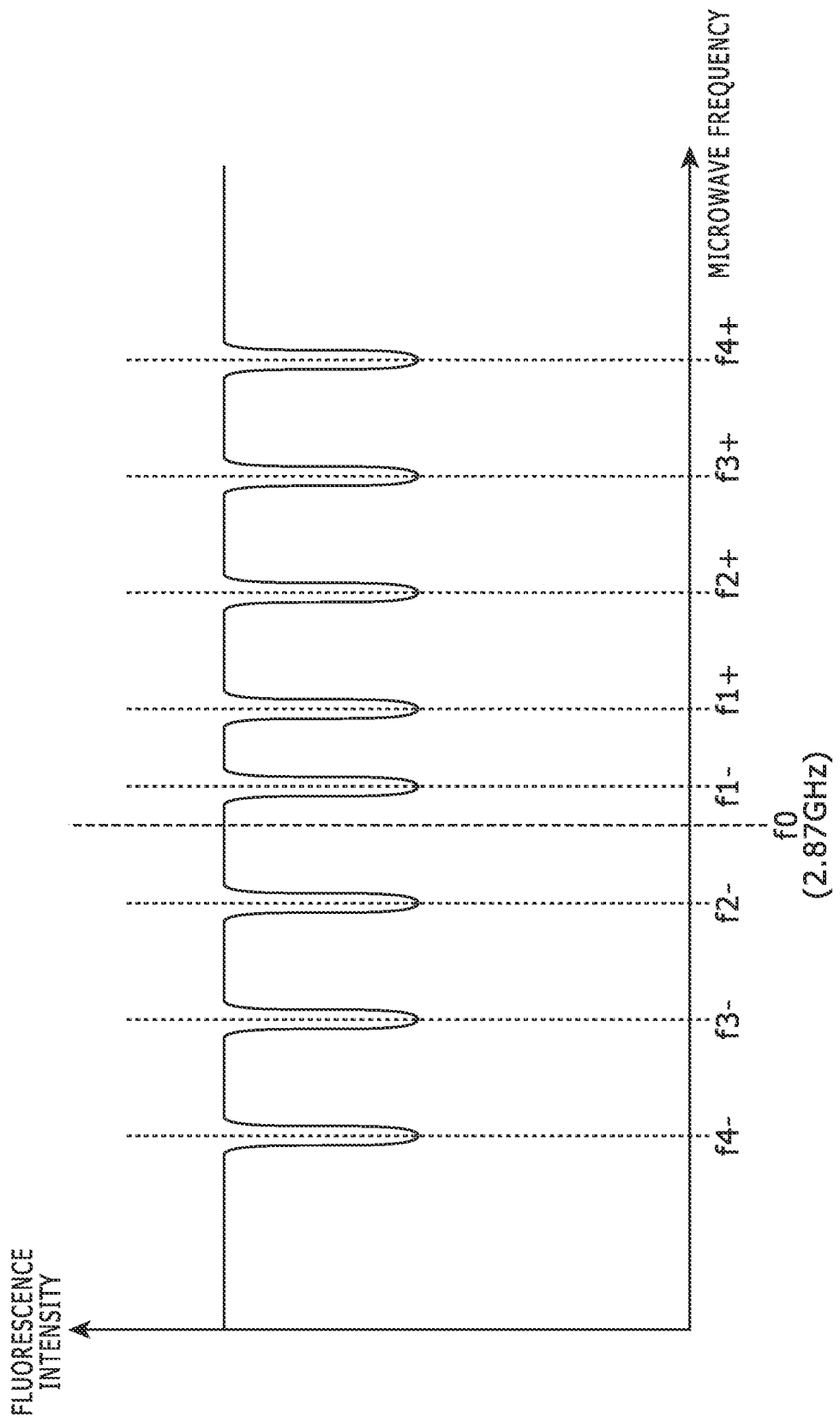
FIG. 3 shows a diagram that explains a frequency characteristic of fluorescence intensities corresponding to plural orientations of an NV Center after Zeeman splitting of the NV Center.

FIG. 3 shows a diagram that explains a frequency characteristic of a fluorescence intensity (characteristic of fluorescence intensities to microwave frequencies) corresponding to plural orientations of an NV Center after Zeeman splitting of the NV Center. If the static magnetic field Bo is applied to the magnetic resonance member 1, the sublevels after Zeeman splitting in the NV Centers in the four N-V orientations are different from each other, and therefore, as shown in FIG. 3, dip frequency pairs (fi+, fi−) different from each other appear correspondingly to the orientations i in a fluorescence intensity characteristic to microwave frequencies. Thus, four dip frequency pairs (fi+, fi−) individually appear correspondingly to the aforementioned four N-V orientations i.

Further, the aforementioned microwave includes frequency components including predetermined dip frequencies (microwave frequencies that fluorescence intensities descend in ODMR) corresponding to the aforementioned target axes for the measurement target magnetic field Bt. If the static magnetic field Bo is applied to the magnetic resonance member 1, the predetermined dip frequencies are those after Zeeman splitting as shown in FIG. 3; and if the static magnetic field Bo is not applied to the magnetic resonance member 1, the predetermined dip frequencies are in a state without Zeeman splitting.

Figure 4:
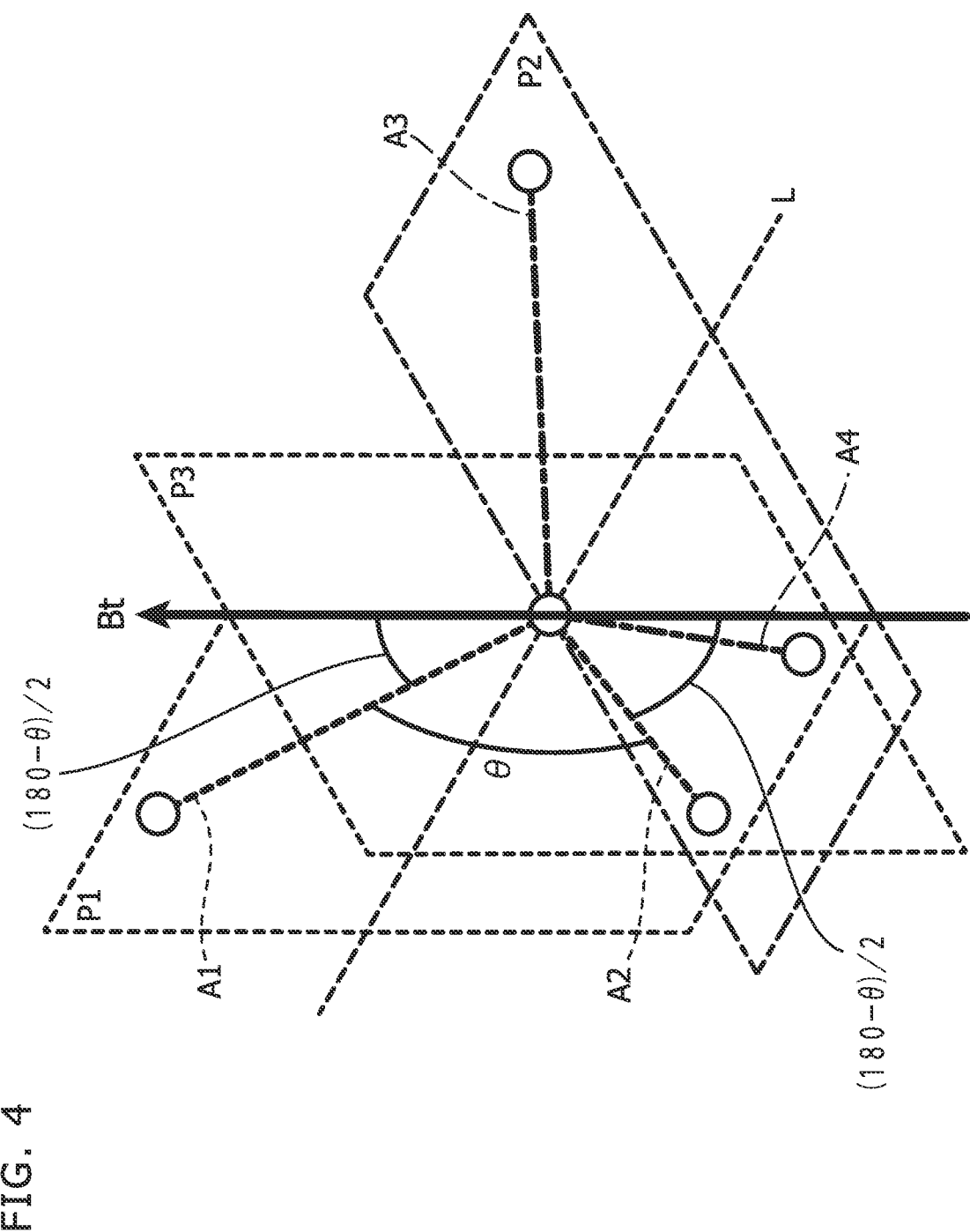
FIG. 4 shows a perspective view diagram that explains an application direction of a measurement target magnetic field Bt in Embodiment 1.

FIG. 4 shows a perspective view diagram that explains an application direction of a measurement target magnetic field Bt in Embodiment 1.

In Embodiment 1, when the aforementioned target axes are set as two axes A1, A2 among the aforementioned four axes A1 to A4, and an angle of the measurement target magnetic field Bt from one axis among the target axes A1, A2 is set as a variable, a value of the variable for maximizing the sensitivity (a sum of parallel components of the measurement target magnetic field Bt to the two target axes A1, A2) is $((180−\theta)/2)$ degrees where $\theta$ is a connection angle of carbon atoms in a diamond crystal (about 109 degrees).

Therefore, in Embodiment 1, as shown in FIG. 4, the magnetic resonance member 1 is arranged such that the measurement target magnetic field Bt has a direction with angles of substantial $((180−\theta)/2)$ degrees from two axes A1, A2 among the four axes A1 to A4 that indicates four connection directions of carbon atoms in the diamond crystal in the magnetic resonance member 1.

Thus, as shown in FIG. 4, when a plane spanned by the axes A1, A2 is P1, a plane spanned by the A3, A4 is P2, and a plane perpendicular to the both planes P1, P2 is P3, the magnetic resonance member 1 is arranged such that a direction of the measurement target magnetic field Bt is substantially parallel to the planes P1, P3 and substantially perpendicular to the plane P2.

Therefore, in Embodiment 1, the aforementioned microwave includes frequency components including predetermined dip frequencies corresponding to the aforementioned two axes A1, A2.

In Embodiment 1, amplitudes of components of the measurement target magnetic field Bt in directions of the target axes A1, A2 are $Bt*\cos((180−\theta)/2)$, and amplitudes of components of the measurement target magnetic field Bt in directions of the target axes A3, A4 are zero. Therefore, the sensitivity of the magnetic resonance member 1 in Embodiment 1 is $2*\cos((180−\theta)/2)$ times (i.e. about 1.63 times) of a reference sensitivity. Here, the reference sensitivity is a sensitivity of an NV Center that the measurement target magnetic field Bt is applied to the magnetic resonance member 1 in parallel with only one axis of the diamond crystal, and this axis agrees with an N-V orientation of the NV Center.

Returning to FIG. 1, the processor 11 includes a computer, for example, and executes a program with the computer and thereby acts as sorts of processing units. In this embodiment, the processor 11 saves signal data detected optically or electrically into an unshown storage device (memory or the like), and performs control and execution operations as a measurement control unit 21 and a calculation unit 22.

The measurement control unit 21 controls the high frequency power supply 12 and determines a detection value of the physical phenomenon (here, an intensity of the fluorescence) detected by the aforementioned detecting device (here, the irradiating device 4 and the light receiving device 5).

In this embodiment, the measurement control unit 21 controls the high frequency power supply 12 and the irradiating device 4 in accordance with a predetermined measurement sequence and thereby determines a detection light intensity of the fluorescence detected by the light receiving device 5. For example, the irradiating device 4 includes a laser diode or the like as a light source, and the light receiving device 5 includes a photo diode or the like as a photodetector, and the measurement control unit 21 determines the aforementioned detection light intensity on the basis of an output signal of the light receiving device 5, and this output signal is obtained by amplification and/or the like of an output signal of the photodetector.

The calculation unit 22 calculates the measurement target magnetic field on the basis of the detection value obtained by the measurement control unit 21 and saved in the storage device.

For example, the measurement control unit 21 controls the high frequency power supply 12 and irradiating device 4 in accordance with a predetermined measurement sequence and thereby determines a detection value of the aforementioned physical phenomenon. In this embodiment, this measurement sequence is set in accordance with a frequency or the like of the measurement target magnetic field. For example, if the measurement target magnetic field is a DC (direct current) magnetic field, a monotonically-increasing magnetic field with a relatively low rate, or a monotonically-decreasing magnetic field with a relatively low rate, Ramsey pulse sequence is applied as this measurement sequence; and if the measurement target magnetic field is an AC (alternating current) magnetic field of a relatively high frequency, a spin echo pulse sequence (Hahn echo sequence or the like) is applied as this measurement sequence. The measurement sequence is not limited to them. For example, if the measurement target magnetic field is an AC (alternating current) magnetic field of a relatively low frequency, magnetic field measurement may be performed plural times in one period of the measurement target magnetic field in accordance with Ramsey pulse sequence (i.e. a measurement sequence for a DC magnetic field), and the measurement target magnetic field (intensities, waveform or the like of it) may be determined on the basis of magnetic field measurement results.

The following part explains a behavior of the magnetic field measurement apparatus in Embodiment 1.

Firstly, the magnetic sensor unit 10 is arranged such that the magnetic resonance member 1 is arranged correspondingly to a direction of the measurement target magnetic field Bt as mentioned.

Subsequently, the measurement control unit 21 performs a predetermined measurement sequence, and thereby obtains a detection value (here, fluorescence intensity) of the physical phenomenon of the magnetic resonance member 1 from the magnetic sensor unit 10; and the calculation unit 22 determines a magnetic field (intensity and/or the like) on the basis of the detection value. In this process, intensities of the physical phenomenon (here, fluorescence) due to the plural target axes are combined and thereby the detection value is gained and the sensitivity gets high.

In the measurement sequence, at predetermined timing, using the high frequency power supply 12, the measurement control unit 21 causes the high-frequency magnetic field generator 2 to conduct microwave current that includes frequency components including dip frequencies corresponding to the target axes as mentioned, and thereby causes the high-frequency magnetic field generator 2 to apply the microwave to the magnetic resonance member 1.

As mentioned, in aforementioned Embodiment 1, the magnetic resonance member 1 includes a diamond crystal including plural diamond nitrogen vacancy center, and the high-frequency magnetic field generator 2 applies magnetic field of microwave to the magnetic resonance member 1. The aforementioned plural diamond nitrogen vacancy centers include diamond nitrogen vacancy centers arranged in directions of predetermined plural axes among four axes that indicates four connection directions of carbon atoms in the diamond crystal; and the aforementioned magnetic resonance member 1 is arranged in a direction that provides a substantially largest sensitivity of the measurement target magnetic field in the diamond nitrogen vacancy centers arranged in the predetermined plural axes.

Specifically, in Embodiment 1, the target axes are two axes among the four axes that indicates four connection directions of carbon atoms in the diamond crystal, and the magnetic resonance member 1 is arranged such that when a connection angle of carbon atoms in the diamond crystal is $\theta$, the measurement target magnetic field Bt has a direction with angles of substantial $((180-\theta)/2)$ degrees from the two axes as the target axes and with angles of substantial 90 degrees from remaining two axes among the four axes.

Consequently, the measurement target magnetic field Bt is applied with most proper angles to the target axes (the two axes in Embodiment 1), and the measurement target magnetic field Bt is detected with a favorable sensitivity.

Embodiment 2

Figure 5:
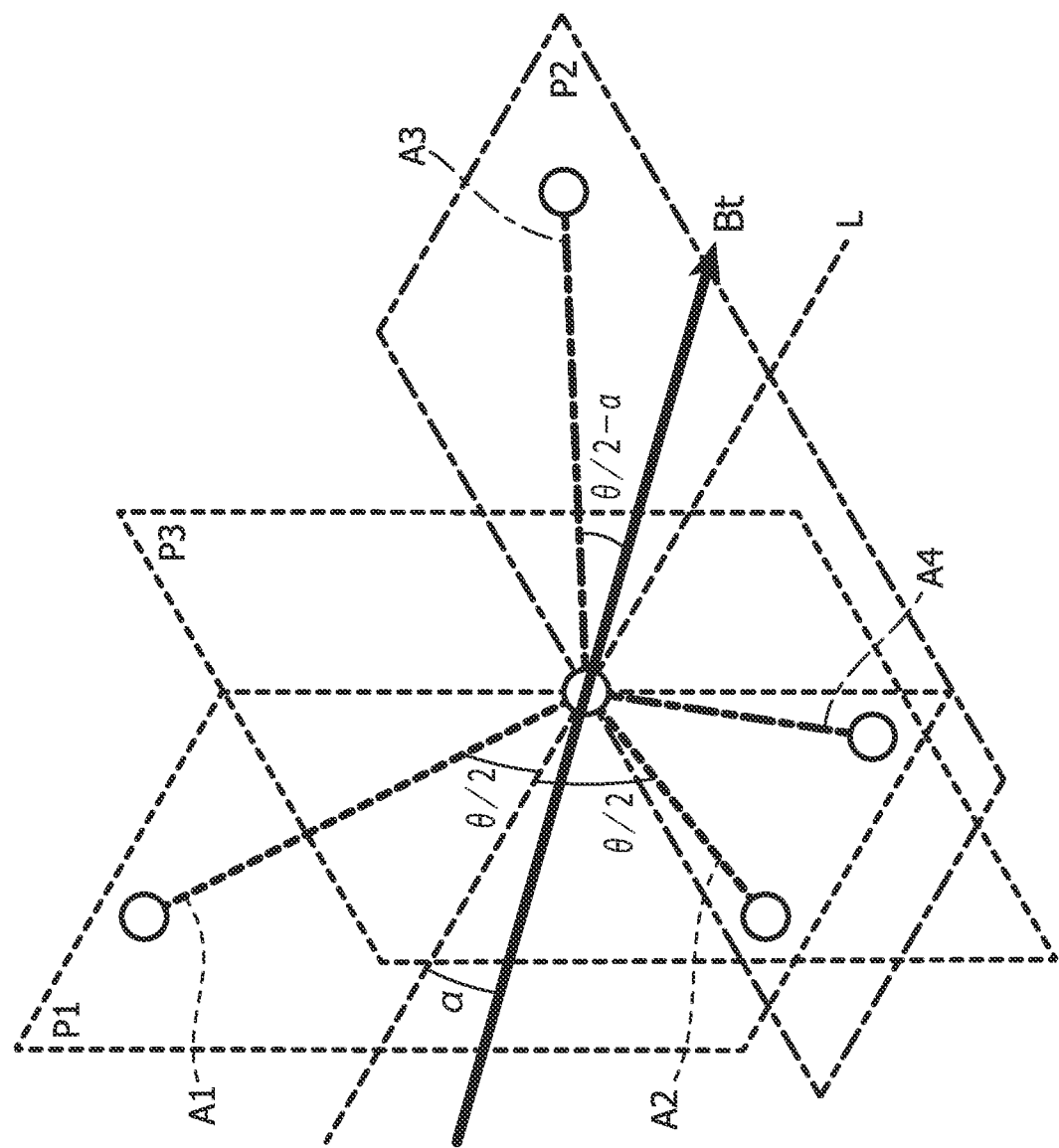
FIG. 5 shows a perspective view diagram that explains an application direction of a measurement target magnetic field Bt in Embodiment 2.

FIG. 5 shows a perspective view diagram that explains an application direction of a measurement target magnetic field Bt in Embodiment 2.

In Embodiment 2, as shown in FIG. 5, the aforementioned target axes are three axes A1, A2, A3 among the aforementioned the four axes A1 to A4, and when a connection angle of carbon atoms in the diamond crystal is $\theta$ (about 109 degrees), an angle to the measurement target magnetic field Bt from a straight line L that passes a center between two axes A1, A2 among the four axes that indicates four connection directions of carbon atoms in the diamond crystal in the magnetic resonance member 1 is $\alpha$, and $\alpha$ is set as an variable, a value of the $\alpha$ is substantially $\arctan(\tan(\theta/2)/3)$ for maximizing the sensitivity (here, a sum of components in parallel with the three axes A1, A2, A3 of the measurement target magnetic field Bt).

Therefore, in Embodiment 2, the magnetic resonance member 1 is arranged such that the measurement target magnetic field Bt takes (a) same angles from the aforementioned two axes A1, A2 and (b) the aforementioned $\alpha$ is substantially $\arctan(\tan(\theta/2)/3)$.

Thus, as shown in FIG. 5, when a plane spanned by the axes A1, A2 is P1 and a plane spanned by the A3, A4 is P2, the magnetic resonance member 1 is arranged such that a direction of the measurement target magnetic field Bt is substantially parallel to the plane P2 and crosses the plane P1 substantially with the angle $\alpha$.

Hence, in Embodiment 2, the aforementioned microwave includes frequency components including predetermined dip frequencies corresponding to the aforementioned three axes A1, A2, A3.

In Embodiment 2, in the measurement target magnetic field Bt, intensities of components in directions of the target axes A1, A2 are $Bt*\cos(\alpha)*\cos(\theta/2)$, and an intensity of a component in a direction of the target axis A3 is $Bt*\cos(\theta/2-\alpha)$. Therefore, the sensitivity of the magnetic resonance member 1 in Embodiment 2 is $(2*\cos(a)*\cos(\theta/2)+\cos(\theta-\alpha))$ times (i.e. about 1.92 times because the aforementioned angle $\alpha$ is about 25.0 degrees (=$\arctan(0.467)$)) of the reference sensitivity. Here, the reference sensitivity is the same as that as mentioned.

Other parts of the configuration and behaviors of the magnetic field measurement apparatus in Embodiment 2 are identical or similar to those in Embodiment 1, and therefore not explained here.

As mentioned, in the aforementioned Embodiment 2, the target axes are three axes, and consequently, the measurement target magnetic field Bt is applied with most proper angles to these target axes, and the measurement target magnetic field Bt is detected with a favorable sensitivity.

Embodiment 3

Figure 6:
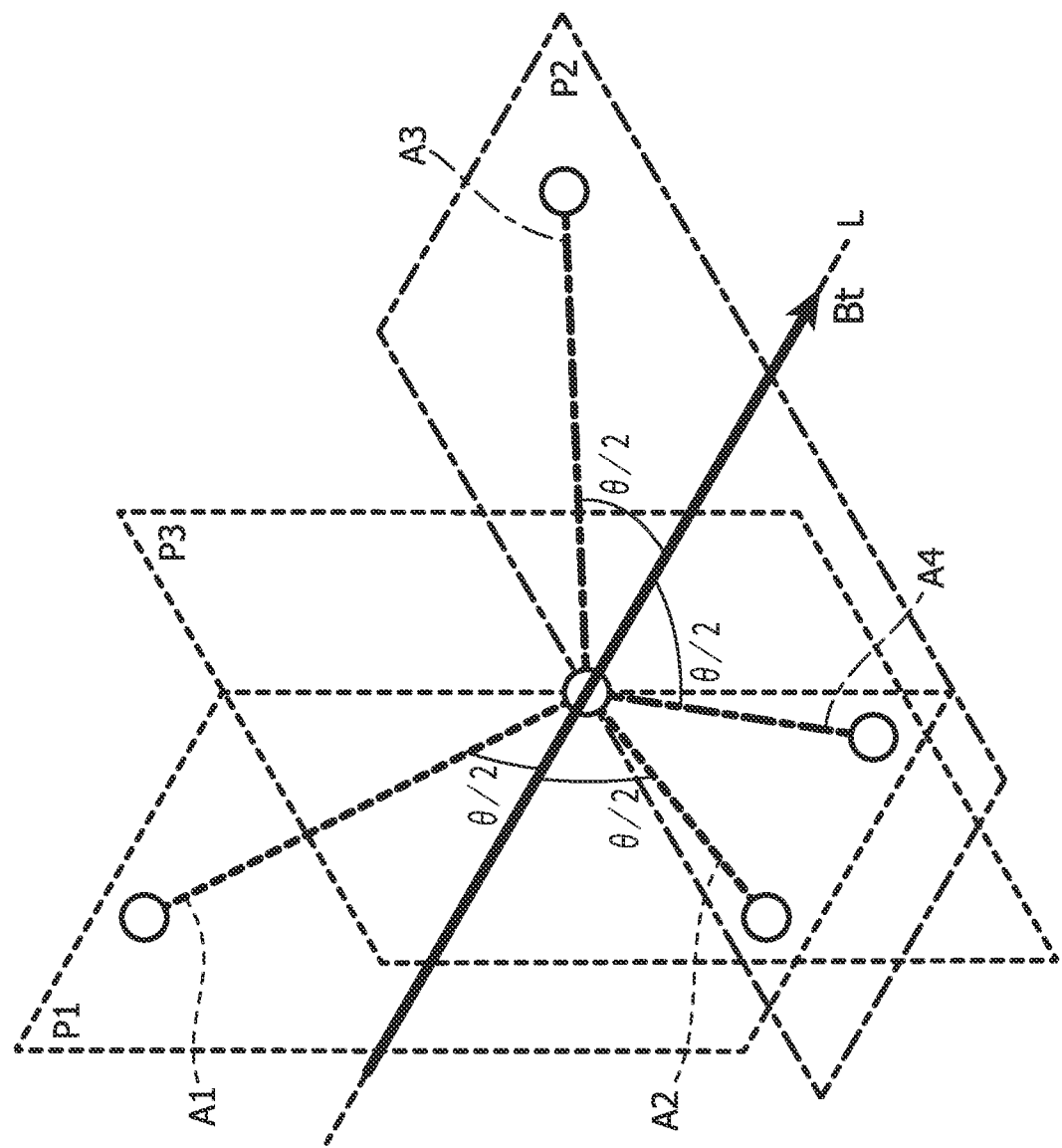
FIG. 6 shows a perspective view diagram that explains an application direction of a measurement target magnetic field Bt in Embodiment 3.

FIG. 6 shows a perspective view diagram that explains an application direction of a measurement target magnetic field Bt in Embodiment 3.

In Embodiment 3, the aforementioned target axes are set as all of the aforementioned four axes A1 to A4 in FIG. 6, and when an angle of the measurement target magnetic field Bt from one axis among the target axes A1 to A4 is set as variable, a value of the variable for maximizing the sensitivity (here, a sum of components in parallel with the four axes A1 to A4 of the measurement target magnetic field Bt) is $(\theta/2)$ degrees where a connection angle of carbon atoms in the diamond crystal is $\theta$ (about 109 degrees).

Therefore, in Embodiment 3, as shown in FIG. 6, the magnetic resonance member 1 is arranged such that the measurement target magnetic field Bt takes substantial $(\theta/2)$ degrees from the four axes that indicates four connection directions of carbon atoms in the diamond crystal in the magnetic resonance member 1.

Thus, as shown in FIG. 6, when a plane spanned by the axes A1, A2 is P1, a plane spanned by the A3, A4, and a plane perpendicular to the both planes P1, P2 is P3, the magnetic resonance member 1 is arranged such that a direction of the measurement target magnetic field Bt is substantially parallel to the planes P1, P2 and substantially perpendicular to the plane P3.

Hence, in Embodiment 3, the aforementioned microwave includes frequency components including predetermined dip frequencies corresponding to the aforementioned four axes A1 to A4.

In Embodiment 3, in the measurement target magnetic field Bt, intensities of components in directions of the axes A1, A2, A3, A4 are $Bt*\cos(\theta/2)$. Therefore, the sensitivity of the magnetic resonance member 1 in Embodiment 3 is (4*cos(θ/2)) times (i.e. about 2.32 times) of the reference sensitivity. Here, the reference sensitivity is the same as that as mentioned.

Other parts of the configuration and behaviors of the magnetic field measurement apparatus in Embodiment 3 are identical or similar to those in Embodiment 1, and therefore not explained here.

As mentioned, in the aforementioned Embodiment 3, the target axes are four axes, and consequently, the measurement target magnetic field Bt is applied with most proper angles to these target axes, and the measurement target magnetic field Bt is detected with a favorable sensitivity.

Further, it should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

INDUSTRIAL APPLICABILITY

For example, the present invention is applicable to a magnetic field measurement apparatus and a magnetic field measurement method.

The invention claimed is:
1. A magnetic field measurement apparatus, comprising:
a magnetic resonance member that includes a diamond crystal including plural diamond nitrogen vacancy center;
a high-frequency magnetic field generator that applies a magnetic field as a microwave to the magnetic resonance member;
a high frequency power supply that causes the high-frequency magnetic field generator to conduct a current for the microwave;
a detecting device that detects a physical phenomenon corresponding to a measurement target magnetic field in the magnetic resonance member;
a measurement control unit that controls the high frequency power supply and determines a detection value detected by the detecting device; and
a calculation unit that calculates the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal;
the magnetic resonance member is arranged in a direction that provides a substantially largest sensitivity of the measurement target magnetic field in the diamond nitrogen vacancy centers arranged in the predetermined plural axes; and
wherein the microwave includes frequency components including predetermined dip frequencies due to the measurement target magnetic field corresponding to the predetermined plural axes.

2. A magnetic field measurement apparatus, comprising:
a magnetic resonance member that includes a diamond crystal including plural diamond nitrogen vacancy center;
a high-frequency magnetic field generator that applies a magnetic field as a microwave to the magnetic resonance member;
a high frequency power supply that causes the high-frequency magnetic field generator to conduct a current for the microwave;
a detecting device that detects a physical phenomenon corresponding to a measurement target magnetic field in the magnetic resonance member;
a measurement control unit that controls the high frequency power supply and determines a detection value detected by the detecting device; and
a calculation unit that calculates the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal;
the magnetic resonance member is arranged in a direction that provides a substantially largest sensitivity of the measurement target magnetic field in the diamond nitrogen vacancy centers arranged in the predetermined plural axes;
wherein the magnetic resonance member is arranged such that when a connection angle of carbon atoms in the diamond crystal is θ and an angle to the measurement target magnetic field from a straight line that passes a center between two axes among the four axes that indicates four connection directions of carbon atoms in the diamond crystal is a, (a) the measurement target magnetic field has a direction with same angles from the two axes and (b) the a is substantially arctan (tan(θ/2)/3); and
the predetermined plural axes are three axes that includes the two axes among the four axes.

3. A magnetic field measurement apparatus, comprising:
a magnetic resonance member that includes a diamond crystal including plural diamond nitrogen vacancy center;
a high-frequency magnetic field generator that applies a magnetic field as a microwave to the magnetic resonance member;
a high frequency power supply that causes the high-frequency magnetic field generator to conduct a current for the microwave;
a detecting device that detects a physical phenomenon corresponding to a measurement target magnetic field in the magnetic resonance member;
a measurement control unit that controls the high frequency power supply and determines a detection value detected by the detecting device; and
a calculation unit that calculates the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal;
the magnetic resonance member is arranged in a direction that provides a substantially largest sensitivity of the measurement target magnetic field in the diamond nitrogen vacancy centers arranged in the predetermined plural axes;
wherein the magnetic resonance member is arranged such that when a connection angle of carbon atoms in the diamond crystal is q, the measurement target magnetic field has a direction with angles of substantial (θ/2)

degrees From the four axes that indicates four connection directions of carbon atoms in the diamond crystal; and the predetermined plural axes are the four axes.

4. A magnetic field measurement method, comprising the steps of:
applying magnetic field of microwave to a magnetic resonance member that includes a diamond crystal including plural diamond nitrogen vacancy center;
detecting a physical phenomenon corresponding to a measurement target magnetic field in the magnetic resonance member and determining a detection value of the physical phenomenon; and
calculating the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal; and
the magnetic resonance member is arranged in a direction that provides a substantially largest sensitivity of the measurement target magnetic field in the diamond nitrogen vacancy centers arranged in the predetermined plural axes; and the microwave includes frequency components including predetermined dip frequencies due to the measurement target magnetic field corresponding to the predetermined plural axes.

5. A magnetic field measurement method, comprising the steps of:
applying magnetic field of microwave to a magnetic resonance member that includes a diamond crystal including plural diamond nitrogen vacancy center;
detecting a physical phenomenon corresponding to a measurement target magnetic field in the magnetic resonance member and determining a detection value of the physical phenomenon; and
calculating the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal; and
the magnetic resonance member is arranged in a direction that provides a substantially largest sensitivity of the measurement target magnetic field in the diamond nitrogen vacancy centers arranged in the predetermined plural axes;
wherein the magnetic resonance member is arranged such that when a connection angle of carbon atoms in the diamond crystal is $\theta$, the measurement target magnetic field has a direction with angles of substantial $((180-\theta)/2)$ degrees From two axes among the four axes that indicates four connection directions of carbon atoms in the diamond crystal; and
the predetermined plural axes are the two axes that have directions with angles of substantial $((180-\theta)/2)$ degrees From the measurement target magnetic field.

6. A magnetic field measurement method, comprising the steps of:
applying magnetic field of microwave to a magnetic resonance member that includes a diamond crystal including plural diamond nitrogen vacancy center;
detecting a physical phenomenon corresponding to a measurement target magnetic field in the magnetic resonance member and determining a detection value of the physical phenomenon; and
calculating the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal; and
the magnetic resonance member is arranged in a direction that provides a substantially largest sensitivity of the measurement target magnetic field in the diamond nitrogen vacancy centers arranged in the predetermined plural axes;
wherein the magnetic resonance member is arranged such that when a connection angle of carbon atoms in the diamond crystal is $\theta$ and an angle to the measurement target magnetic field from a straight line that passes a center between two axes among the four axes that indicates four connection directions of carbon atoms in the diamond crystal is a, (a) the measurement target magnetic field has a direction with same angles from the two axes and (b) the a is substantially arctan $(\tan(\theta/2)/3)$; and
the predetermined plural axes are three axes that includes the two axes among the four axes.

7. A magnetic field measurement method, comprising the steps of:
applying magnetic field of microwave to a magnetic resonance member that includes a diamond crystal including plural diamond nitrogen vacancy center;
detecting a physical phenomenon corresponding to a measurement target magnetic field in the magnetic resonance member and determining a detection value of the physical phenomenon; and
calculating the measurement target magnetic field on the basis of the detection value;
wherein the plural diamond nitrogen vacancy centers include diamond nitrogen vacancy centers arranged in directions of predetermined plural axes among four axes that indicates four connection directions of carbon atoms in the diamond crystal; and
the magnetic resonance member is arranged in a direction that provides a substantially largest sensitivity of the measurement target magnetic field in the diamond nitrogen vacancy centers arranged in the predetermined plural axes;
wherein the magnetic resonance member is arranged such that when a connection angle of carbon atoms in the diamond crystal is q, the measurement target magnetic field has a direction with angles of substantial $(\theta/2)$ degrees From the four axes that indicates four connection directions of carbon atoms in the diamond crystal; and the predetermined plural axes are the four axes.

8. A magnetic field measurement apparatus, comprising:
a magnetic resonance member that includes a diamond crystal including plural diamond nitrogen vacancy center;
a high-frequency magnetic field generator that applies a magnetic field as a microwave to the magnetic resonance member;
a high frequency power supply that causes the high-frequency magnetic field generator to conduct a current for the microwave;
a detecting device that detects a physical phenomenon corresponding to a measurement target magnetic field in the magnetic resonance member;

a measurement control unit that controls the high frequency power supply and determines a detection value detected by the detecting device; and a calculation unit that calculates the measurement target magnetic field on the basis of the detection value;

wherein the plural diamond nitrogen vacancy centers include diamond nitrogen vacancy centers arranged in directions of predetermined plural axes among four axes that indicates four connection directions of carbon atoms in the diamond crystal;

the magnetic resonance member is arranged in a direction that provides a substantially largest sensitivity of the measurement target magnetic field in the diamond nitrogen vacancy centers arranged in the predetermined plural axes;

wherein the magnetic resonance member is arranged such that when a connection angle of carbon atoms in the diamond crystal is $\theta$, the measurement target magnetic field has a direction with angles of substantial $((180-\theta)/2)$ degrees From two axes among the four axes that indicates four connection directions of carbon atoms in the diamond crystal; and the predetermined plural axes are the two axes that have directions with angles of substantial $((180-\theta)/2)$ degrees From the measurement target magnetic field.

* * * * *

UNITED STATES PATENT AND TRADEMARK OFFICE
CERTIFICATE OF CORRECTION

PATENT NO. : 12,140,648 B2  
APPLICATION NO. : 17/922473  
DATED : November 12, 2024  
INVENTOR(S) : Yoshii Page 1 of 1

It is certified that error appears in the above-identified patent and that said Letters Patent is hereby corrected as shown below:

On the Title Page

Item (73), incorrectly lists "Kyocera Document Solutions, Inc." as the assignee. The correct assignees should be "SUMIDA CORPORATION" and "Kyoto University". The residence of Japan is correct.

Signed and Sealed this  
Sixth Day of May, 2025

Coke Morgan Stewart  
*Acting Director of the United States Patent and Trademark Office*